United States Patent
Riepen

(10) Patent No.: US 9,140,995 B2
(45) Date of Patent: Sep. 22, 2015

(54) FLUID HANDLING STRUCTURE, A LITHOGRAPHIC APPARATUS AND A DEVICE MANUFACTURING METHOD

(71) Applicant: Michel Riepen, Veldhoven (NL)

(72) Inventor: Michel Riepen, Veldhoven (NL)

(73) Assignee: ASML NETHERLANDS B.V., Veldhoven (NL)

( * ) Notice: Subject to any disclaimer, the term of this patent is extended or adjusted under 35 U.S.C. 154(b) by 387 days.

(21) Appl. No.: 13/656,424

(22) Filed: Oct. 19, 2012

(65) Prior Publication Data
US 2013/0100425 A1    Apr. 25, 2013

Related U.S. Application Data

(60) Provisional application No. 61/550,712, filed on Oct. 24, 2011.

(51) Int. Cl.
| G03B 27/32 | (2006.01) |
|---|---|
| G03B 27/42 | (2006.01) |
| G03B 27/52 | (2006.01) |
| G03F 7/20 | (2006.01) |

(52) U.S. Cl.
CPC .......... *G03F 7/70341* (2013.01); *G03F 7/2041* (2013.01)

(58) Field of Classification Search
CPC ............................ G03F 7/2041; G03F 7/70341
USPC ................................................. 355/30, 53, 77
See application file for complete search history.

(56) References Cited

U.S. PATENT DOCUMENTS

| 4,509,852 A | 4/1985 | Tabarelli et al. |
|---|---|---|
| 7,119,874 B2 | 10/2006 | Cox et al. |
| 7,701,550 B2 | 4/2010 | Kemper et al. |
| 7,701,551 B2 | 4/2010 | De Graaf |
| 8,345,218 B2 | 1/2013 | Riepen et al. |
| 8,614,784 B2 | 12/2013 | Riepen et al. |
| 2004/0207824 A1 | 10/2004 | Lof et al. |
| 2005/0018155 A1 | 1/2005 | Cox et al. |
| 2006/0038968 A1 | 2/2006 | Kemper et al. |
| 2006/0290908 A1* | 12/2006 | De Graaf et al. ............... 355/53 |
| 2007/0243329 A1* | 10/2007 | De Graaf ...................... 427/256 |

(Continued)

FOREIGN PATENT DOCUMENTS

| CN | 101452219 | 6/2009 |
|---|---|---|
| CN | 101576718 | 11/2009 |

(Continued)

OTHER PUBLICATIONS

Korean Office Action mailed Feb. 28, 2014 in corresponding Korean Patent Application No. 10-2012-0117513.

(Continued)

*Primary Examiner* — Colin Kreutzer
(74) *Attorney, Agent, or Firm* — Pillsbury Winthrop Shaw Pittman LLP

(57) ABSTRACT

A fluid handling structure for a lithographic apparatus, the fluid handling structure to confine liquid to a space, the fluid handling structure having, on an undersurface surrounding the space, a liquid supply opening to supply liquid onto an undersurface of the fluid handling structure and, radially inward with respect to the space of the liquid supply opening, a two dimensional array of liquid extraction openings to extract a liquid from the space and to extract liquid on the undersurface from the liquid supply opening.

20 Claims, 7 Drawing Sheets

(56) References Cited

U.S. PATENT DOCUMENTS

| | | | |
|---|---|---|---|
| 2008/0212046 A1 | 9/2008 | Riepen et al. | |
| 2009/0073395 A1 | 3/2009 | Berkvens et al. | |
| 2009/0237631 A1* | 9/2009 | Poon et al. | 355/30 |
| 2009/0279060 A1 | 11/2009 | Direcks et al. | |
| 2009/0279062 A1 | 11/2009 | Direcks et al. | |
| 2009/0279063 A1 | 11/2009 | Riepen et al. | |
| 2010/0196832 A1* | 8/2010 | Nagasaka | 430/325 |
| 2010/0323303 A1 | 12/2010 | Nagasaka | |
| 2011/0090472 A1 | 4/2011 | Riepen et al. | |
| 2011/0128516 A1 | 6/2011 | Kaneko et al. | |
| 2011/0134400 A1* | 6/2011 | Shibazaki | 355/30 |
| 2011/0134401 A1 | 6/2011 | Rops et al. | |
| 2011/0277859 A1 | 11/2011 | Cortie et al. | |
| 2012/0057139 A1* | 3/2012 | Tanimoto et al. | 355/30 |

FOREIGN PATENT DOCUMENTS

| | | |
|---|---|---|
| EP | 1 420 298 | 5/2004 |
| JP | 2005-045223 | 2/2005 |
| JP | 2006-253456 | 9/2006 |
| JP | 2007-053193 | 3/2007 |
| JP | 2007-288185 | 11/2007 |
| JP | 2009-021498 | 1/2009 |
| JP | 2010-199619 | 9/2010 |
| JP | 2010-205914 | 9/2010 |
| JP | 2011-035423 | 2/2011 |
| JP | 2011-071511 | 4/2011 |
| JP | 2011-124569 | 6/2011 |
| JP | 2011-238930 | 11/2011 |
| KR | 10-1005039 | 12/2010 |
| WO | 99/49504 | 9/1999 |

OTHER PUBLICATIONS

Chinese Office Action dated Mar. 31, 2014 in corresponding Chinese Patent Application No. 201210391367,1.

Japanese Office Action mailed Nov. 21, 2013 in corresponding Japanese Patent Application No. 2012-232278.

* cited by examiner

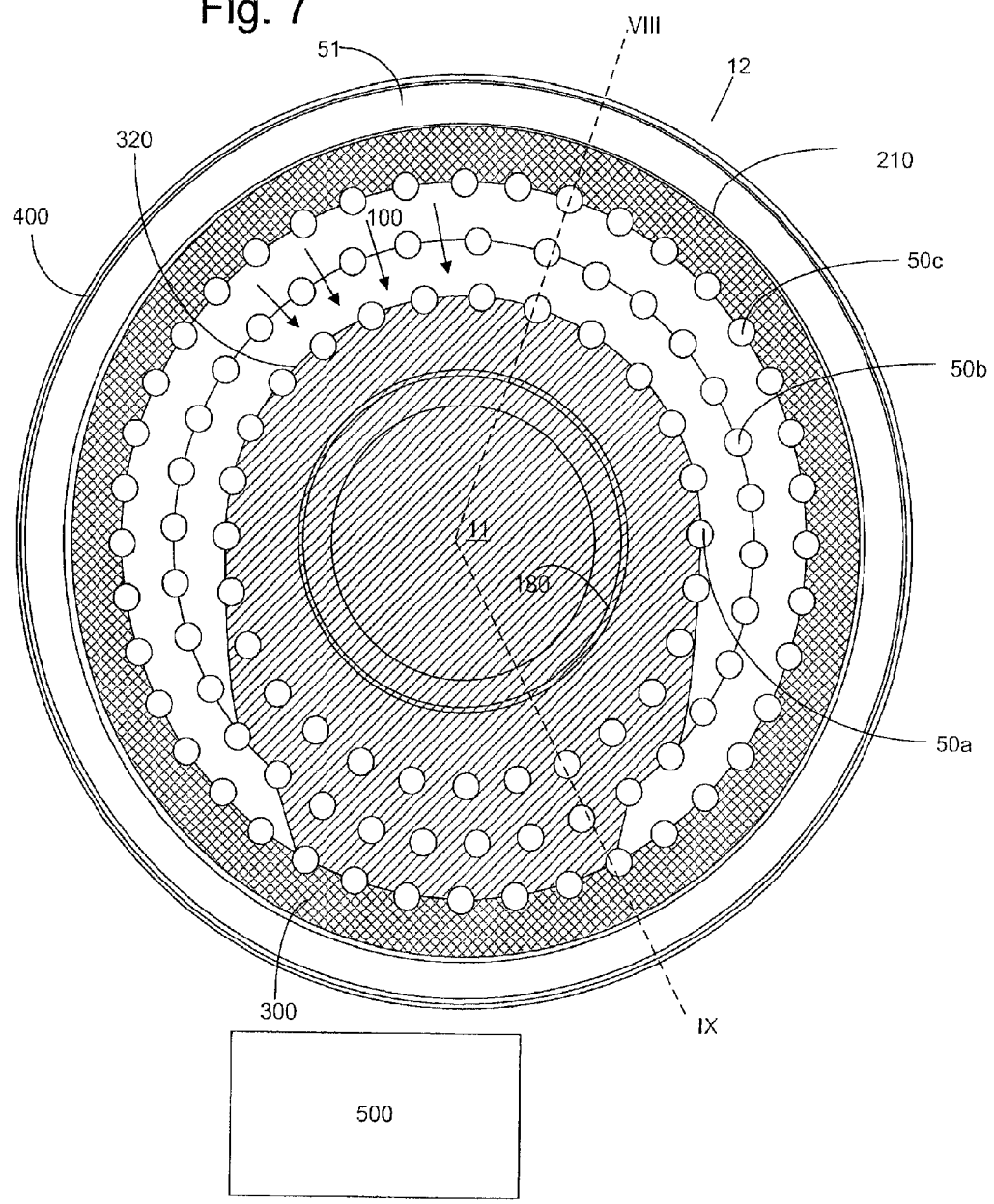

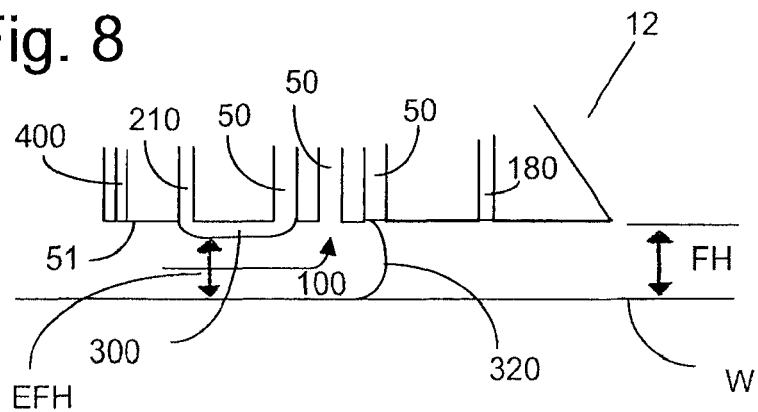
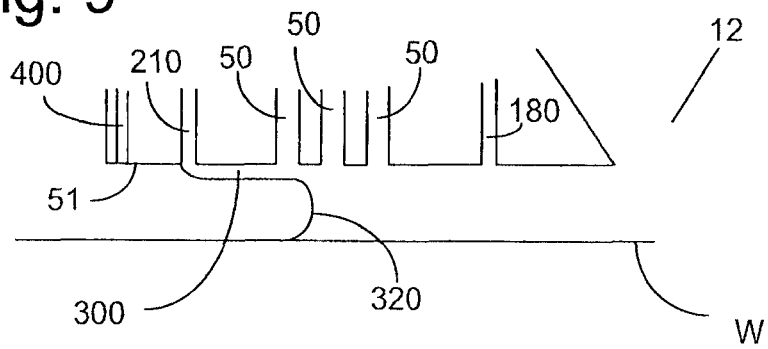

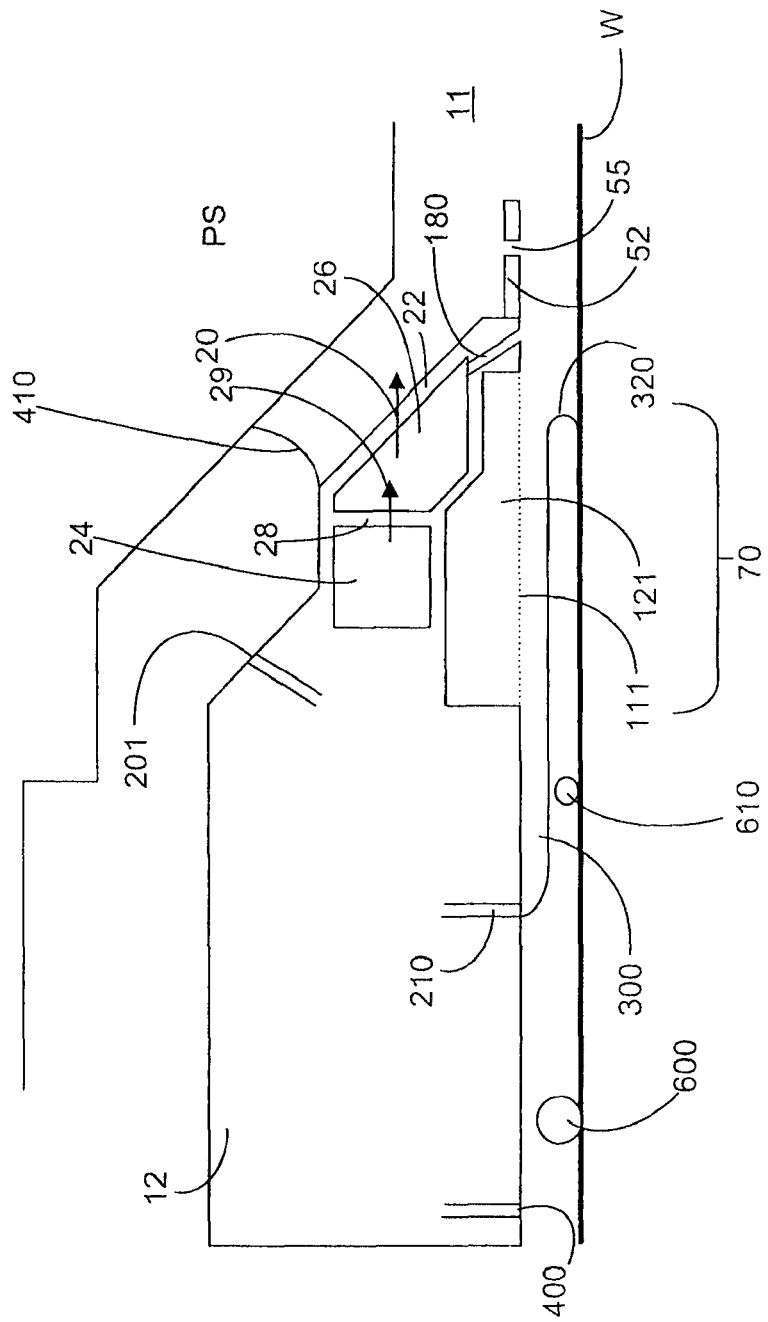

FLUID HANDLING STRUCTURE, A LITHOGRAPHIC APPARATUS AND A DEVICE MANUFACTURING METHOD

This application claims priority and benefit under 35 U.S.C. §119(e) to U.S. Provisional Patent Application No. 61/550,712, filed on Oct. 24, 2011. The content of that application is incorporated herein in its entirety by reference.

FIELD

The present invention relates to a fluid handling structure, a lithographic apparatus, a method for manufacturing a device using a lithographic apparatus, and a method of operating a lithographic apparatus.

BACKGROUND

A lithographic apparatus is a machine that applies a desired pattern onto a substrate, usually onto a target portion of the substrate. A lithographic apparatus can be used, for example, in the manufacture of integrated circuits (ICs). In that instance, a patterning device, which is alternatively referred to as a mask or a reticle, may be used to generate a circuit pattern to be formed on an individual layer of the IC. This pattern can be transferred onto a target portion (e.g. comprising part of, one, or several dies) on a substrate (e.g. a silicon wafer). Transfer of the pattern is typically via imaging onto a layer of radiation-sensitive material (resist) provided on the substrate. In general, a single substrate will contain a network of adjacent target portions that are successively patterned. Known lithographic apparatus include so-called steppers, in which each target portion is irradiated by exposing an entire pattern onto the target portion at one time, and so-called scanners, in which each target portion is irradiated by scanning the pattern through a radiation beam in a given direction (the "scanning"-direction) while synchronously scanning the substrate parallel or anti-parallel to this direction. It is also possible to transfer the pattern from the patterning device to the substrate by imprinting the pattern onto the substrate.

It has been proposed to immerse the substrate in the lithographic projection apparatus in a liquid having a relatively high refractive index, e.g. water, so as to fill a space between the final element of the projection system and the substrate. In an embodiment, the liquid is distilled water, although another liquid can be used. An embodiment of the invention will be described with reference to liquid. However, another fluid may be suitable, particularly a wetting fluid, an incompressible fluid and/or a fluid with higher refractive index than air, desirably a higher refractive index than water. Fluids excluding gases are particularly desirable. The point of this is to enable imaging of smaller features since the exposure radiation will have a shorter wavelength in the liquid. (The effect of the liquid may also be regarded as increasing the effective numerical aperture (NA) of the system and also increasing the depth of focus.) Other immersion liquids have been proposed, including water with solid particles (e.g. quartz) suspended therein, or a liquid with a nano-particle suspension (e.g. particles with a maximum dimension of up to 10 nm). The suspended particles may or may not have a similar or the same refractive index as the liquid in which they are suspended. Other liquids which may be suitable include a hydrocarbon, such as an aromatic, a fluorohydrocarbon, and/or an aqueous solution.

Submersing the substrate or substrate and substrate table in a bath of liquid (see, for example, U.S. Pat. No. 4,509,852) means that there is a large body of liquid that must be accelerated during a scanning exposure. This requires additional or more powerful motors and turbulence in the liquid may lead to undesirable and unpredictable effects.

In an immersion apparatus, immersion fluid is handled by a fluid handling system, device structure or apparatus. In an embodiment the fluid handling system may supply immersion fluid and therefore be a fluid supply system. In an embodiment the fluid handling system may at least partly confine immersion fluid and thereby be a fluid confinement system. In an embodiment the fluid handling system may provide a barrier to immersion fluid and thereby be a barrier member, such as a fluid confinement structure. In an embodiment the fluid handling system may create or use a flow of gas, for example to help in controlling the flow and/or the position of the immersion fluid. The flow of gas may form a seal to confine the immersion fluid so the fluid handling structure may be referred to as a seal member; such a seal member may be a fluid confinement structure. In an embodiment, immersion liquid is used as the immersion fluid. In that case the fluid handling system may be a liquid handling system. In reference to the aforementioned description, reference in this paragraph to a feature defined with respect to fluid may be understood to include a feature defined with respect to liquid.

SUMMARY

It is desirable to be able to move the substrate as fast as possible below the projection system. For this, the fluid handling system, especially for a localized area fluid handling system, should be designed to allow a high scanning speed without significant liquid loss. Some liquid is likely to be lost and left behind on the surface (e.g. substrate or substrate table) facing the fluid handling system (i.e. a facing surface). If any such liquid, for example in the form of a droplet, comes into contact with a meniscus extending between the facing surface and the fluid handling system, for example as a collision between a droplet and a meniscus, this may cause inclusion of a gas bubble into the liquid. If such a gas bubble finds its way into the path taken by the projection beam through the immersion liquid, this can lead to an imaging defect and is therefore undesirable.

Use of a flow of gas in a fluid handling system to help in controlling the position of immersion liquid can be problematical if the flow is high. This is because with a high flow rate of gas, significant evaporation of liquid can occur. This presents a difficulty because this can result in a high local cooling load.

It is desirable, for example, to provide a lithographic apparatus in which the likelihood of bubble inclusion is at least reduced, and/or gas flow can be reduced compared to gas flow in a fluid handling structure which makes use of a gas drag principle (such as described in United States patent application publication no. US 2008-0212046).

According to an aspect, there is provided a fluid handling structure for a lithographic apparatus, the fluid handling structure to confine liquid to a space, the fluid handling structure having, on an undersurface surrounding the space, at least one liquid supply opening to supply liquid onto an undersurface of the fluid handling structure and, radially inward with respect to the space of the at least one liquid supply opening, a two dimensional array of liquid extraction openings to extract liquid from the space and to extract liquid on the undersurface from the at least one liquid supply opening.

According to an aspect, there is provided a fluid handling structure for a lithographic apparatus, the fluid handling structure having, on an undersurface surrounding a space for liquid: a two dimensional array of liquid extraction openings radially outward of the space, and at least one liquid supply opening to supply a liquid onto an undersurface of the fluid handling structure, the at least one liquid supply opening radially outward of the two dimensional array of liquid extraction openings, wherein the two dimensional array of liquid extraction openings is configured to extract liquid from the space and to extract the liquid supplied to the undersurface by the at least one liquid supply opening.

According to an aspect, there is provided a fluid handling structure for a lithographic apparatus, the fluid handling structure having, on an undersurface surrounding a space to confine fluid, a two dimensional array of liquid extraction openings and at least one liquid supply opening to keep radially outer openings of the two dimensional array wet.

According to an aspect, there is provided a device manufacturing method, comprising: providing a liquid between a final element of a projection system and a surface facing the final element and confining the liquid to a space through which a projection beam of radiation passes using a fluid handling structure; providing a radially inward flow of liquid through at least one liquid supply opening on an undersurface of the fluid handling structure; and extracting liquid from the space and from the undersurface using a two dimensional array of liquid extraction openings.

BRIEF DESCRIPTION OF THE DRAWINGS

Embodiments of the invention will now be described, by way of example only, with reference to the accompanying schematic drawings in which corresponding reference symbols indicate corresponding parts, and in which:

FIG. 7 depicts, in plan, the liquid supply system of FIG. 6, in use;

FIG. 8 depicts a cross-section of FIG. 6 along line VIII;

FIG. 9 depicts a cross-section of FIG. 6 along line IX; and

FIG. 10 depicts, in cross-section, a liquid supply system according to an embodiment.

DETAILED DESCRIPTION

Figure 1:
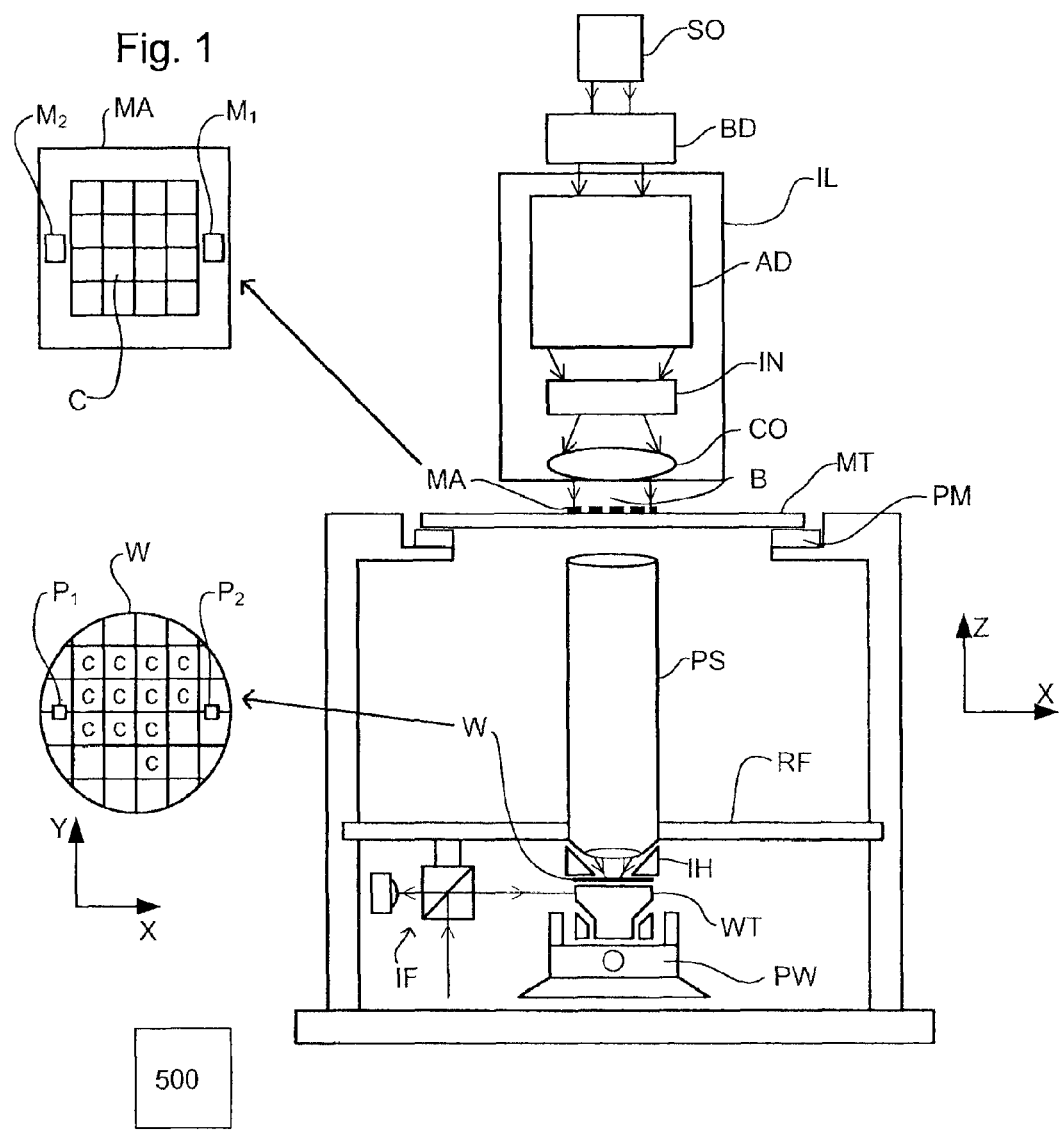
FIG. 1 depicts a lithographic apparatus according to an embodiment of the invention.

FIG. 1 schematically depicts a lithographic apparatus according to one embodiment of the invention. The apparatus comprises:

an illumination system (illuminator) IL configured to condition a radiation beam B (e.g. UV radiation or DUV radiation);
a support structure (e.g. a mask table) MT constructed to support a patterning device (e.g. a mask) MA and connected to a first positioner PM configured to accurately position the patterning device MA in accordance with certain parameters;
a support table, e.g. a sensor table to support one or more sensors or a substrate table WT constructed to hold a substrate (e.g. a resist-coated substrate) W, connected to a second positioner PW configured to accurately position the surface of the table, for example of a substrate W, in accordance with certain parameters; and
a projection system (e.g. a refractive projection lens system) PS configured to project a pattern imparted to the radiation beam B by patterning device MA onto a target portion C (e.g. comprising one or more dies) of the substrate W.

The illumination system IL may include various types of optical components, such as refractive, reflective, magnetic, electromagnetic, electrostatic or other types of optical components, or any combination thereof, for directing, shaping, or controlling radiation.

The support structure MT holds the patterning device MA. It holds the patterning device MA in a manner that depends on the orientation of the patterning device MA, the design of the lithographic apparatus, and other conditions, such as for example whether or not the patterning device MA is held in a vacuum environment. The support structure MT can use mechanical, vacuum, electrostatic or other clamping techniques to hold the patterning device MA. The support structure MT may be a frame or a table, for example, which may be fixed or movable as required. The support structure MT may ensure that the patterning device MA is at a desired position, for example with respect to the projection system PS. Any use of the terms "reticle" or "mask" herein may be considered synonymous with the more general term "patterning device."

The term "patterning device" used herein should be broadly interpreted as referring to any device that can be used to impart a radiation beam with a pattern in its cross-section such as to create a pattern in a target portion of the substrate. It should be noted that the pattern imparted to the radiation beam may not exactly correspond to the desired pattern in the target portion of the substrate, for example if the pattern includes phase-shifting features or so called assist features. Generally, the pattern imparted to the radiation beam will correspond to a particular functional layer in a device being created in the target portion, such as an integrated circuit.

The patterning device MA may be transmissive or reflective. Examples of patterning devices include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions. The tilted mirrors impart a pattern in a radiation beam which is reflected by the mirror matrix.

The term "projection system" used herein should be broadly interpreted as encompassing any type of projection system, including refractive, reflective, catadioptric, magnetic, electromagnetic and electrostatic optical systems, or any combination thereof, as appropriate for the exposure radiation being used, or for other factors such as the use of an immersion liquid or the use of a vacuum. Any use of the term "projection lens" herein may be considered as synonymous with the more general term "projection system".

As here depicted, the apparatus is of a transmissive type (e.g. employing a transmissive mask). Alternatively, the apparatus may be of a reflective type (e.g. employing a programmable mirror array of a type as referred to above, or employing a reflective mask).

The lithographic apparatus may be of a type having two or more tables (or stage or support), e.g., two or more substrate tables or a combination of one or more substrate tables and one or more sensor or measurement tables. In such "multiple stage" machines the multiple tables may be used in parallel, or preparatory steps may be carried out on one or more tables while one or more other tables are being used for exposure. The lithographic apparatus may have two or more patterning device tables (or stages or support) which may be used in parallel in a similar manner to substrate, sensor and measurement tables.

Referring to FIG. 1, the illuminator IL receives a radiation beam from a radiation source SO. The source SO and the lithographic apparatus may be separate entities, for example when the source SO is an excimer laser. In such cases, the source SO is not considered to form part of the lithographic apparatus and the radiation beam is passed from the source SO to the illuminator IL with the aid of a beam delivery system BD comprising, for example, suitable directing mirrors and/or a beam expander. In other cases the source SO may be an integral part of the lithographic apparatus, for example when the source SO is a mercury lamp. The source SO and the illuminator IL, together with the beam delivery system BD if required, may be referred to as a radiation system.

The illuminator IL may comprise an adjuster AD for adjusting the angular intensity distribution of the radiation beam. Generally, at least the outer and/or inner radial extent (commonly referred to as σ-outer and σ-inner, respectively) of the intensity distribution in a pupil plane of the illuminator IL can be adjusted. In addition, the illuminator IL may comprise various other components, such as an integrator IN and a condenser CO. The illuminator IL may be used to condition the radiation beam, to have a desired uniformity and intensity distribution in its cross-section. Similar to the source SO, the illuminator IL may or may not be considered to form part of the lithographic apparatus. For example, the illuminator IL may be an integral part of the lithographic apparatus or may be a separate entity from the lithographic apparatus. In the latter case, the lithographic apparatus may be configured to allow the illuminator IL to be mounted thereon. Optionally, the illuminator IL is detachable and may be separately provided (for example, by the lithographic apparatus manufacturer or another supplier).

The radiation beam B is incident on the patterning device (e.g., mask) MA, which is held on the support structure (e.g., mask table) MT, and is patterned by the patterning device MA. Having traversed the patterning device MA, the radiation beam B passes through the projection system PS, which focuses the beam onto a target portion C of the substrate W. With the aid of the second positioner PW and position sensor IF (e.g. an interferometric device, linear encoder or capacitive sensor), the substrate table WT can be moved accurately, e.g. so as to position different target portions C in the path of the radiation beam B. Similarly, the first positioner PM and another position sensor (which is not explicitly depicted in FIG. 1) can be used to accurately position the patterning device MA with respect to the path of the radiation beam B, e.g. after mechanical retrieval from a mask library, or during a scan. In general, movement of the support structure MT may be realized with the aid of a long-stroke module (coarse positioning) and a short-stroke module (fine positioning), which form part of the first positioner PM. Similarly, movement of the substrate table WT may be realized using a long-stroke module and a short-stroke module, which form part of the second positioner PW. In the case of a stepper (as opposed to a scanner) the support structure MT may be connected to a short-stroke actuator only, or may be fixed. Patterning device MA and substrate W may be aligned using patterning device alignment marks M1, M2 and substrate alignment marks P1, P2. Although the substrate alignment marks as illustrated occupy dedicated target portions, they may be located in spaces between target portions C (these are known as scribe-lane alignment marks). Similarly, in situations in which more than one die is provided on the patterning device MA, the patterning device alignment marks may be located between the dies.

The depicted apparatus could be used in at least one of the following modes:

1. In step mode, the support structure MT and the substrate table WT are kept essentially stationary, while an entire pattern imparted to the radiation beam B is projected onto a target portion C at one time (i.e. a single static exposure). The substrate table WT is then shifted in the X and/or Y direction so that a different target portion C can be exposed. In step mode, the maximum size of the exposure field limits the size of the target portion C imaged in a single static exposure.

2. In scan mode, the support structure MT and the substrate table WT are scanned synchronously while a pattern imparted to the radiation beam B is projected onto a target portion C (i.e. a single dynamic exposure). The velocity and direction of the substrate table WT relative to the support structure MT may be determined by the (de-)magnification and image reversal characteristics of the projection system PS. In scan mode, the maximum size of the exposure field limits the width (in the non-scanning direction) of the target portion C in a single dynamic exposure, whereas the length of the scanning motion determines the height (in the scanning direction) of the target portion C.

3. In another mode, the support structure MT is kept essentially stationary holding a programmable patterning device, and the substrate table WT is moved or scanned while a pattern imparted to the radiation beam is projected onto a target portion C. In this mode, generally a pulsed radiation source is employed and the programmable patterning device is updated as required after each movement of the substrate table WT or in between successive radiation pulses during a scan. This mode of operation can be readily applied to maskless lithography that utilizes programmable patterning device, such as a programmable mirror array of a type as referred to above.

Combinations and/or variations on the above described modes of use or entirely different modes of use may also be employed.

Although specific reference may be made in this text to the use of lithographic apparatus in the manufacture of ICs, it should be understood that the lithographic apparatus described herein may have other applications in manufacturing components with microscale, or even nanoscale, features, such as the manufacture of integrated optical systems, guidance and detection patterns for magnetic domain memories, flat-panel displays, liquid-crystal displays (LCDs), thin-film magnetic heads, etc.

Arrangements for providing liquid between a final element of the projection system PS and the substrate can be classed into three general categories. These are the bath type arrangement, the so-called localized immersion system and the all-wet immersion system. In a bath type arrangement substantially the whole of the substrate W and optionally part of the substrate table WT is submersed in a bath of liquid.

A localized immersion system uses a liquid supply system in which liquid is only provided to a localized area of the substrate. The space filled by liquid is smaller in plan than the top surface of the substrate and the area filled with liquid remains substantially stationary relative to the projection system PS while the substrate W moves underneath that area. FIGS. 2-7 show different supply devices which can be used in such a system. A sealing feature is present to substantially seal liquid to the localized area. One way which has been proposed to arrange for this is disclosed in PCT patent application publication no. WO 99/49504.

In an all wet arrangement the liquid is unconfined. The whole top surface of the substrate and all or part of the substrate table is covered in immersion liquid. The depth of the liquid covering at least the substrate is small. The liquid may be a film, such as a thin film, of liquid on the substrate. Immersion liquid may be supplied to or in the region of a projection system and a facing surface facing the projection system (such a facing surface may be the surface of a substrate and/or a substrate table). Any of the liquid supply devices of FIGS. 2-5 can also be used in such a system. However, a sealing feature is not present, not activated, not as efficient as normal or otherwise ineffective to seal liquid to only the localized area.

Figure 2:
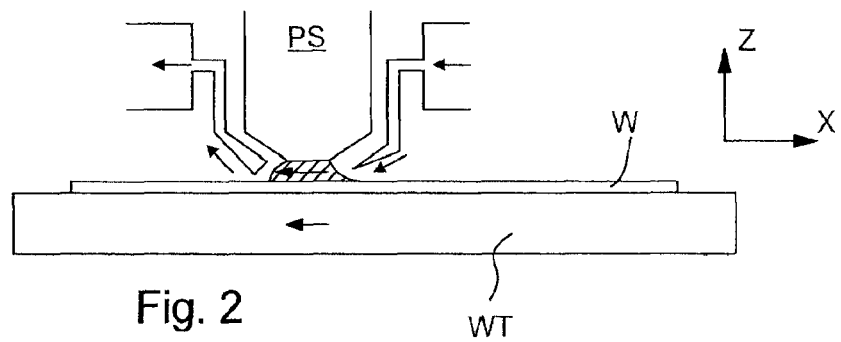
FIGS. 2 and 3 depict a liquid supply system for use in a lithographic projection apparatus.
Figure 3:
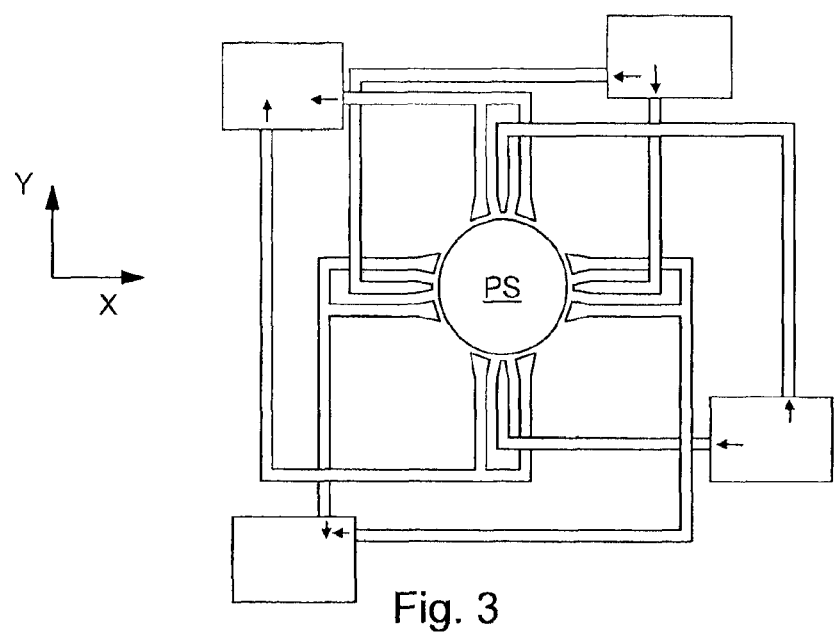

As illustrated in FIGS. 2 and 3, liquid is supplied by at least one inlet onto the substrate, desirably along the direction of movement of the substrate relative to the final element. Liquid is removed by at least one outlet after having passed under the projection system. As the substrate is scanned beneath the element in a −X direction, liquid is supplied at the +X side of the element and taken up at the −X side. FIG. 2 shows the arrangement schematically in which liquid is supplied via inlet and is taken up on the other side of the element by outlet which is connected to a low pressure source. In the illustration of FIG. 2 the liquid is supplied along the direction of movement of the substrate relative to the final element, though this does not need to be the case. Various orientations and numbers of in- and out-lets positioned around the final element are possible; one example is illustrated in FIG. 3 in which four sets of an inlet with an outlet on either side are provided in a regular pattern around the final element. Note that the direction of flow of the liquid is shown by arrows in FIGS. 2 and 3.

Figure 4:
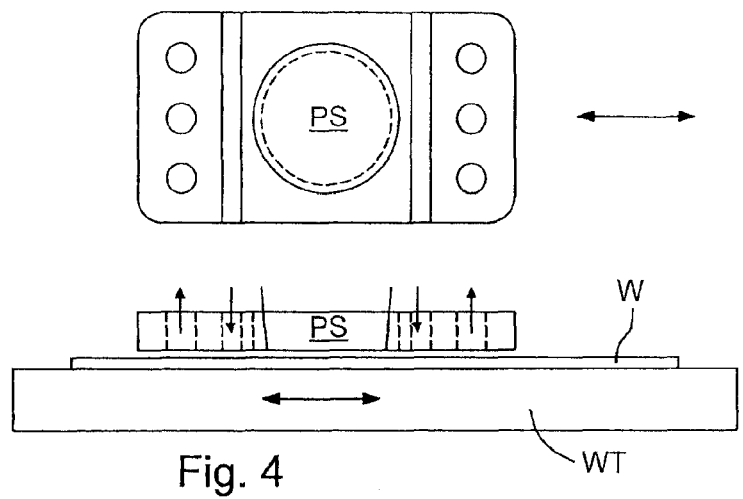
FIG. 4 depicts a further liquid supply system for use in a lithographic projection apparatus.

A further immersion lithography solution with a localized liquid supply system is shown in FIG. 4. Liquid is supplied by two groove inlets on either side of the projection system PS and is removed by a plurality of discrete outlets arranged radially outwardly of the inlets. The inlets can be arranged in a plate with a hole in its centre and through which the projection beam is projected. Liquid is supplied by one groove inlet on one side of the projection system PS and removed by a plurality of discrete outlets on the other side of the projection system PS, causing a flow of a thin film of liquid between the projection system PS and the substrate W. The choice of which combination of inlet and outlets to use can depend on the direction of movement of the substrate W (the other combination of inlet and outlets being inactive). Note that the direction of flow of fluid and of the substrate is shown by arrows in FIG. 4.

Another arrangement which has been proposed is to provide the liquid supply system with a liquid confinement structure which extends along at least a part of a boundary of the space between the final element of the projection system and the substrate table. Such an arrangement is illustrated in FIG. 5.

Figure 5:
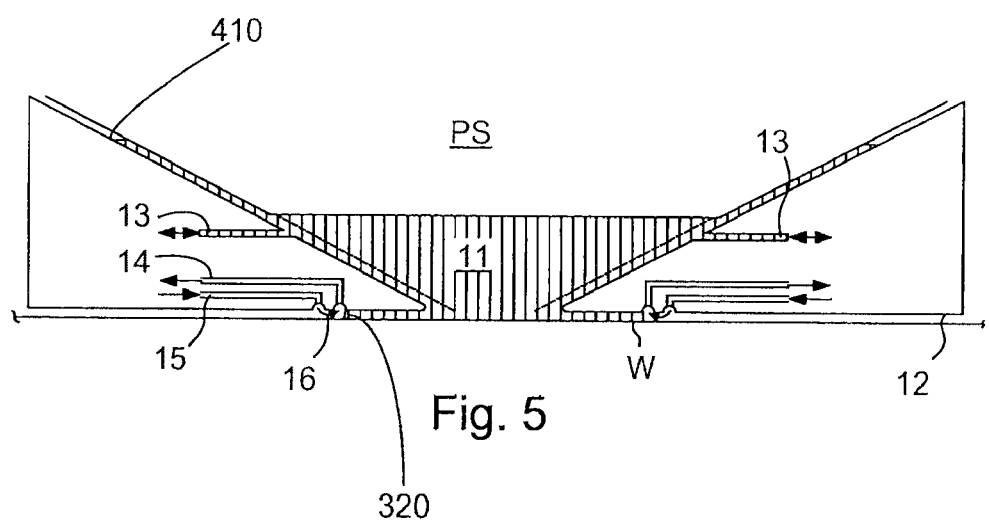
FIG. 5 depicts a further liquid supply system for use in a lithographic projection apparatus.

FIG. 5 schematically depicts a localized liquid supply system or fluid handling structure 12. The fluid handing structure serves as a barrier, confining liquid to a localized surface of the underneath surface, such as of a substrate W, a substrate table WT or both. The fluid handling structure extends along at least a part of a boundary of the space between the final element of the projection system and the substrate table WT or substrate W. (Please note that reference in the following text to surface of the substrate W also refers in addition or in the alternative to a surface of the substrate table, unless expressly stated otherwise.) The fluid handling structure 12 is substantially stationary relative to the projection system in the XY plane though there may be some relative movement in the Z direction (in the direction of the optical axis). In an embodiment, a seal is formed between the fluid handling structure 12 and the surface of the substrate W. The seal may be a contactless seal such as a gas seal (such a system with a gas seal is disclosed in European patent application publication no. EP-A-1,420,298) or a liquid seal.

The fluid handling structure 12 at least partly contains liquid in the space 11 between a final element of the projection system PS and the substrate W. A contactless seal 16 to the substrate W may be formed around the image field of the projection system PS so that liquid is confined within the space between the substrate W surface and the final element of the projection system PS. The space 11 is at least partly formed by the fluid handling structure 12 positioned below and surrounding the final element of the projection system PS. Liquid is brought into the space below the projection system PS and within the fluid handling structure 12 by liquid inlet 13. The liquid may be removed by liquid outlet 13. The fluid handling structure 12 may extend a little above the final element of the projection system. The liquid level rises above the final element so that a buffer of liquid is provided. In an embodiment, the fluid handling structure 12 has an inner periphery that at the upper end closely conforms to the shape of the projection system or the final element thereof and may, e.g., be round. At the bottom, the inner periphery closely conforms to the shape of the image field, e.g., rectangular, though this need not be the case.

The liquid may be contained in the space 11 by a gas seal 16 which, during use, is formed between the bottom of the fluid handling structure 12 and the surface of the substrate W. The gas seal is formed by gas. The gas in the gas seal is provided under pressure via inlet 15 to the gap between the fluid handling structure 12 and substrate W. The gas is extracted via outlet 14. The overpressure on the gas inlet 15, vacuum level on the outlet 14 and geometry of the gap are arranged so that there is a high-velocity gas flow 16 inwardly that confines the liquid. The force of the gas on the liquid between the fluid handling structure 12 and the substrate W contains the liquid in a space 11. The inlets/outlets may be annular grooves which surround the space 11. The annular grooves may be continuous or discontinuous. The flow of gas 16 is effective to contain the liquid in the space 11. Such a system is disclosed in United States patent application publication no. US 2004-0207824, which is hereby incorporated by reference in its entirety. In an embodiment, the fluid handling structure 12 does not have a gas seal.

Another localized area arrangement is a fluid handling structure which makes use of a gas drag principle. The so-called gas drag principle has been described, for example, in United States patent application publication nos. US 2008-0212046, US 2009-0279060 and US 2009-0279062. In that system the extraction holes are arranged in a shape which may desirably have a corner. The cornered shape has at least one low radius part (i.e. at a corner) which has a first radius of curvature which is low relative to a second radius of curvature at a high radius part (i.e. a part between corners and/or distant from corners). The low radius part has a first radius of curvature which is lower than a second radius of curvature present at the high radius part. The second radius of curvature may be infinity i.e. the high radius part may be straight. The corner may be aligned with a preferred direction of movement, such as the stepping or the scanning direction. This reduces the force on the meniscus between two openings in the surface of the fluid handing structure for a given speed in the preferred direction compared to if the two outlets were aligned perpendicular to the preferred direction. However, an embodiment of the invention may be applied to a fluid handling system which in plan has any shape, or has a component such as the extraction openings arranged in any shape. Such a shape in a non-limiting list may include an ellipse such as a circle, a rectilinear shape such as a rectangle, e.g. a square, or a parallelogram such as a rhombus or a cornered shape with more than four corners such as a four or more pointed star.

In a variation of the system of US 2008/0212046 A1, to which an embodiment of the present invention may relate, the geometry of the cornered shape in which the openings are arranged allows sharp corners (between about 60° and 90°, desirably between 75° and 90° and most desirably between 75° and 85°) to be present for the corners aligned both in the scan and in the stepping directions. This allows increased speed in the direction of each aligned corner. This is because the creation of liquid droplets due to an unstable meniscus, for example in exceeding a critical speed, in the scanning direction is reduced. Where corners are aligned with both the scanning and stepping directions, increased speed may be achieved in those directions. Desirably the speed of movement in the scanning and stepping directions may be substantially equal.

An embodiment of the present invention is described herein with reference to a two dimensional array of extraction openings. The supply liquid opening described below can be provided radially outwardly of meniscus pinning features of any type of a liquid handling system. In this way, as described below, large droplets which could cause imaging defects if they collided with the meniscus extending between the facing surface and the meniscus pinning feature can be prevented from reaching the meniscus.

Figure 6:
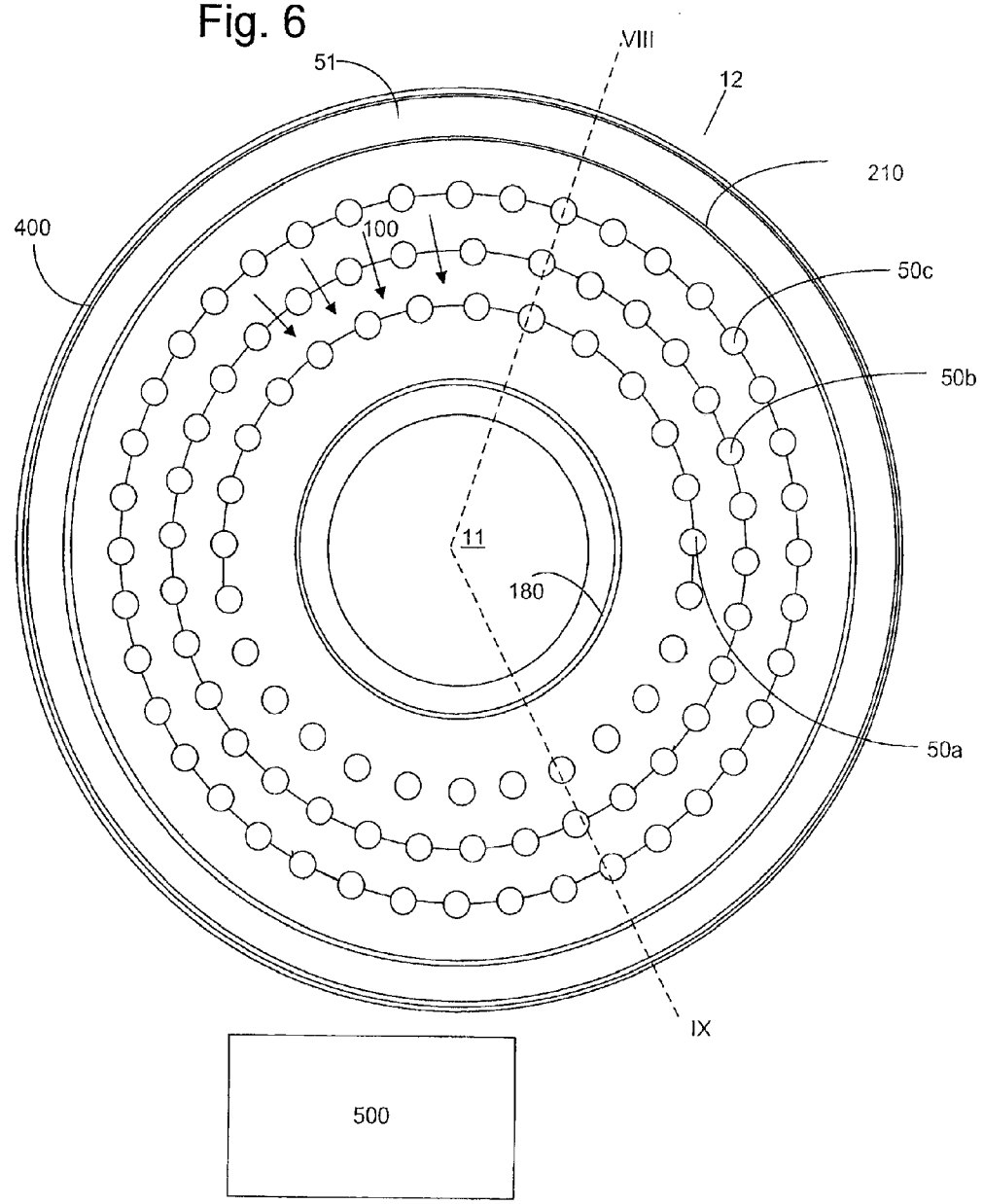
FIG. 6 depicts, in plan, a liquid supply system of an embodiment without liquid.

FIG. 6 illustrates schematically in plan the meniscus pinning features of part of a fluid handling structure in accordance with an embodiment of the invention. The features of a meniscus pinning device are illustrated which may, for example, replace the meniscus pinning arrangement 14, 15, 16 of FIG. 5. The meniscus pinning device of FIG. 6 comprises a plurality of openings 50a, b, c arranged in a two dimensional array. Each of the openings 50a, b, c are illustrated as being circular though this is not necessarily the case. Indeed one or more of the openings 50a, b, c may be, in cross-section, one or more selected from a circle, square, rectangular, oblong, triangular, an elongate slit, etc.

In the embodiment of FIG. 6 each opening 50a, b, c is a fluid extraction opening. The openings 50a, b, c are an inlet for the passage of gas and/or liquid into the fluid handling structure. That is, the opening may be considered as an outlet from the space 11.

The openings 50a, b, c are formed in a surface of a fluid handling structure 12. That surface faces a facing surface, such as the substrate and/or substrate table, in use. In one embodiment the openings are in a flat surface of the fluid handling structure. In another embodiment, a ridge may be present on the surface of the fluid handling structure facing the substrate. In that embodiment the openings 50a, b, c may be in the ridge. In an embodiment, the plurality of openings 50 may be defined by needles or tubes. The bodies of some of the needles, e.g., adjacent needles, may be joined together. The needles may be joined together to form a single body. The single body may form the shape which may be cornered. Liquid is provided radially inwardly of the openings 50a, b, c through supply openings 180 in the undersurface.

In an embodiment, the openings 50a, b, c may each have an area equivalent to that of a circle with a diameter of greater than 50 µm such that the risk of them being blocked by contaminating particles is reduced. The openings 50a, b, c may each have an area equivalent to that of a circle with a diameter of less than 150 µm thereby to keep any curvature of the meniscus 320 extending between openings 50a, b, c small. In an embodiment the openings 50 have a cross-sectional area equivalent to a circular opening with a diameter of at least 80 µm and/or less than 120 µm.

Because the openings 50a, b, c are in a two dimensional linear array, the openings are not formed by a single line of openings 50. That is, at least two openings 50a, 50b, 50c are formed at different radial distances from the space 11, such as a rim of the undersurface of the fluid handling structure 12. In an embodiment there are two lines of openings 50a, 50c. The inner line of openings 50a is primarily to control the position of the meniscus 320 extending between the undersurface of the fluid handling structure and the facing surface (e.g. substrate). The outer line of openings 50c is primarily to collect liquid supplied by at least one liquid supply opening 210 and provided on the undersurface 51 of the fluid handling structure. A gas gap is present between the meniscus defining the position of the liquid on the undersurface between the liquid supply opening 210 and outer line of openings 50c and the facing surface, as is more clearly seen in FIG. 8.

The at least one liquid supply opening 210 may be in the form of a plurality of openings in a line or a slit. A slit width might be between 50 and 150 µm. A plurality of openings would have an equivalent open area per unit length.

At a trailing edge of the two dimensional array of liquid extraction openings 50, a, b, c (i.e. with respect to the direction of relative motion between the facing surface and the undersurface of the liquid confinement structure 12), liquid from the space 11 may be extracted by the outermost liquid extraction openings 50c. Therefore, the two dimensional array allows for some movement of the meniscus 320 relative to the liquid handling structure 12. Therefore, the provision of two rows of openings 50a, b, c provides a buffer to remove excess liquid. That is, when the position of the meniscus 320 moves outward from the optical axis of the projection system the liquid covers more openings 50a, b, c such that the extraction increases. Therefore at a trailing edge, the extraction rate increases with increased displacement between the facing surface and the liquid confinement structure.

At a leading edge of the two dimensional array of liquid extraction openings 50a, b, c (i.e. with respect to the direction of relative motion between the facing surface and the undersurface of the liquid confinement structure 12), liquid from the space 11 is only extracted by the innermost liquid extraction openings 50a. However, the two dimensional array at opposite sides of the immersion space 11 along a certain direction of relative motion function as a leading and trailing edge respectively. When the direction of relative motion reverses, the function of the edges swap, so that at the beginning of movement liquid from the space may be extracted at the trailing edge only from the innermost liquid extraction 50a openings and at the leading edge from both the innermost and outermost liquid extraction openings 50a, 50c. The liquid meniscus at both the leading and trailing edges then moves so that the liquid at the leading edge is extracted from only the innermost openings 50a and the liquid at the trailing edge is extracted from the inner and outermost openings 50a, c.

In an embodiment at least three rows of openings 50a, b, c are provided. The central holes 50b are provided for buffering purposes to extract excess immersion liquid, when needed. For example, middle holes of the two dimensional array (in the radial direction) may usually only have gas passing through them (see FIG. 8). However, when the position of the meniscus 320 extends away from the optical axis of the projection system PS, the central holes can also extract liquid (see FIG. 9). In this way the central holes act as a buffer to remove excess liquid, when needed.

In an embodiment the radially inner and outer most openings 50a, c may have a larger area than the central openings 50b of the two dimensional array of liquid extraction openings. In an embodiment the openings 50a, b, c may not be arranged in rows. An example of this is given in FIG. 10 where the openings are pores of a porous material 111 and so are positioned in two dimensions. In an embodiment, the pores are arranged randomly in two dimensions, may have a honeycomb arrangement, or may be arranged in another regular two dimensional array. The porous material may take the form of a micro-sieve. Micro-sieves made by electroforming, photoetching and/or laser cutting can be used. Suitable sieves are made by Stork Veco B.V., of Eerbeek, the Netherlands.

An example of a linear array is a line along which features are located. An example of a linear array comprises two or more rows of openings. Such a linear array may be referred to as a two dimensional linear array, in which the features are arranged along a line or the array as well as in a direction perpendicular to the line. The openings 50 may be periodically arranged along the linear array. For example the openings along the rows may be staggered. In one or more of the rows of openings, each of the openings may be aligned in a line. The openings in two of the rows may be staggered with respect to each other (i.e. two lines of holes).

In an embodiment the two dimensional array of liquid extraction openings has a width in the radial direction of at least 0.5 mm, desirably at least 0.8 mm to provide enough of a buffer. In an embodiment, the width is at least 1 mm. The two dimensional array of liquid extraction openings desirably has a width of less than or equal to 3 mm. In an embodiment, the width is less than or equal to 2.5 mm. This helps ensure that enough buffer width is present while not taking up too much space on the underside of the fluid handling structure.

FIG. 7 shows an undersurface of a fluid handling structure 12 in use. The area of the undersurface of the fluid confinement structure 12 in contact with the immersion liquid present between the fluid handling structure 12 and the facing surface at a particular moment of time is shown by cross hatching. Note that the cross-hatched area indicates the presence of liquid 300 on the undersurface 51 of the fluid handling structure, but not on the facing surface.

The facing surface is moving downwards with respect to the page. As can be seen, the undersurface of the fluid handling structure 12 in the vicinity of the leading edge of the meniscus extends to the inner most openings 50a of the two dimensional array of openings. At the trailing edge (the bottom side, as illustrated), the liquid meniscus extends to the middle row 50b and even the outer most row of openings 50c of the two dimensional array of extraction openings. Thus, at the trailing edge liquid is recovered through more openings than at the leading edge. This allows a greater extraction rate of liquid from between the fluid handling structure 12 and the facing surface at the trailing edge where more liquid is present (due to the force on the liquid resulting from relative movement between the fluid handling structure 12 and the facing surface).

FIGS. 8 and 9 are cross-sectional representations illustrating the position of the meniscus 320 at the leading edge (FIG. 8, which is a cross section through line VIII of FIG. 6) and at the trailing edge (FIG. 9, which is a cross section through line IX of FIG. 6).

The openings of the two dimensional array of liquid extraction openings 50a, b, c are adjacent on another. That is, no openings are provided on the undersurface 51 between the openings 50a, b, c of the two dimensional array of liquid extraction openings. No openings are provided between the openings 50a, b, c and the at least one liquid supply opening 210.

Each of a plurality of openings 50a, b, c of the meniscus pinning device of FIG. 6 may be connected to a separate under pressure source. Alternatively or additionally, each or a plurality of the openings 50a, b, c may be connected to a common chamber or manifold (which may be annular) which is itself held at an under pressure. In this way a uniform under pressure at each or a plurality of the openings 50a, b, c may be achieved. The opening 50a, b, c can be connected to a vacuum source and/or the atmosphere surrounding the fluid handling structure or system (or confinement structure, barrier member or liquid supply system) may be increased in pressure to generate the desired pressure difference.

The openings 50a, b, c are designed to extract a mixture of liquid and gas. The liquid is extracted from the space 11 whereas the gas is extracted from the atmosphere on the other side of the openings 50a, b, c to the liquid. This creates a gas flow as illustrated by arrows 100 in the top left hand side of FIG. 6 and this gas flow is effective to pin the meniscus 320 between the openings 50a, b, c substantially in place. The gas flow helps maintain the liquid confined by momentum blocking, by a gas flow induced pressure gradient and/or by drag (shear) of the gas flow on the liquid.

The openings 50a, b, c surround the space to which the fluid handling structure supplies liquid. That is, the openings 50a, b, c may be distributed around the surface of the fluid handling structure facing the substrate and/or substrate table. A plurality of the openings 50a, b, c may be substantially continuously spaced around the space. In an embodiment the spacing between some of the adjacent openings may be the same, although the spacing between adjacent openings 50a, b, c may vary. In an embodiment, liquid is extracted all the way around the shape which may be cornered.

In an embodiment, the openings 50a, b, c may be positioned so as to form, in plan, a cornered shape (i.e. a shape with corners). The shape may be a quadrilateral, such as a rhombus, e.g. a square, with curved edges or sides.

Immersion liquid droplets may escape from the space 11 in which the immersion liquid is confined during relative movement under the space 11 of, for example, a height step in the surface facing the space (such as a gap between an edge of a substrate W and an edge of a recess in the table supporting the substrate or the surface of a sensor), and when the relative speed between the fluid handling structure and the facing surface, e.g. scanning speed, is larger than a critical speed (this might be necessary when a higher scanning speed/throughput is required). Such a critical speed may be dependent on at least one property of the facing surface.

In escaping from the immersion liquid in the space, the droplet breaks from the meniscus 320 of the immersion liquid between the fluid handling structure and a facing surface (such as a substrate W or a substrate table WT which supports the substrate W). The meniscus may be pinned to the fluid handling structure 12 by the fluid extraction openings 50a, b, c (the liquid extractor) which may extract liquid and gas in a two phase fluid flow. The droplet may escape from a trailing side of the immersion space 11 with respect to the movement of the facing surface.

When the relative motion between the fluid handling structure 12 and the facing surface in the plane of the facing surface, e.g. the scanning or stepping direction is changed, such a droplet can move relative to the fluid handling structure 12 back towards the liquid meniscus 320. The droplet may be extracted by extraction through the extraction openings 50a, b, c provided at or at least near the edge or boundary of the immersion liquid confined in the space 11. However, if such a droplet is not extracted completely it can create a bubble on collision with the liquid meniscus 320 of the liquid confined in the space.

The droplet may merge with one or more droplets which may be small to form a bigger droplet. Such a droplet will move relative to the fluid handling structure 12 towards the meniscus 320. On contact (or collision) with the meniscus it may potentially create one or more bubbles.

A problem solved with an embodiment of the invention is that in order to remove a droplet from the facing surface, and prevent it from entering the meniscus 320, the droplet needs to make contact with an extractor. Because, for example, 40 µm high droplets may cause a bubble in the space 11 which are large enough to cause imaging defects, the (fly) height FH of the fluid handling structure 12 above the facing surface should be as low as 40 µm. However, this is very difficult from a mechanical point of view, for reasons such as tolerances and risk of collision between, e.g., the facing surface and the undersurface of the fluid handling structure 12.

In an embodiment, the effective fly height EFH is reduced by adding one or more droplets 300 of liquid (hereinafter reference to droplets in this context also includes additionally or alternatively a film of liquid) on the undersurface 51 of the fluid handling structure 12. When a droplet makes contact with the liquid on the undersurface, it is (at least partly) absorbed by the liquid on the undersurface and removed from the facing surface. The droplet on the facing surface is then extracted through an extractor (i.e. an opening 50 of the two dimensional array of openings). The liquid 300 on the undersurface 51 can be as thick as 100-150 µm (for example where the fly height FH is larger than the liquid on the undersurface of course). If the facing surface accidentally hits the liquid on the undersurface 51, no damage occurs to the facing surface or fluid handling structure 12.

Accordingly, a significant improvement in the extraction of droplets on the facing surface may result by the imaginary lowering of the fly height of the fluid handling structure 12 by means of a wet fluid handling structure 12 undersurface 51. Wetting of the fluid handling structure 12 undersurface 51 can be achieved by: small liquid droplets hanging on the undersurface of the fluid handling structure and/or a liquid flow over the undersurface 51 going from a liquid supply to an extraction. Normally liquid droplets with a height lower than the fly height FH will not be extracted without touching the undersurface 51. By "lowering" the fly height with liquid 300 (droplets/film) the returning droplets on the facing surface will contact (e.g. hit) the liquid 300 hanging on the undersurface 51. On contact with the liquid 300 the droplets will merge with the liquid 300. The liquid from the droplets will be extracted through an opening such as shown in FIG. 8 (as described later) or through porous material 111 (see FIG. 10). The effective fly height EFH can be changed mechanically by geometry changes of the fluid handling structure 12 or with one or more liquid 300 droplets (e.g. by varying their size).

Liquid 300 is provided on the undersurface 51 of the fluid handling structure. The liquid 300 does not extend to the facing surface such that there is a gas gap present between liquid supplied on and removed from the undersurface 51 and a surface facing the undersurface (e.g. the facing surface, such as the substrate W). The undersurface 51 between the liquid supply opening 210 and the two dimensional array 50 of openings may be made liquidphilic or lyophilic (for example hydrophilic in the case of water being the immersion liquid) to help the liquid adhere to the undersurface and not drop off. The liquid supply opening 210 may be, for example, a porous material or a porous plate as described in U.S. patent application publication no. 2011/0277859, which is hereby incorporated in its entirety by reference.

The undersurface of the fluid handling structure may be made lyophilic in any way. For example, this may be by way of surface treatment of the area between the liquid supply opening 210 and the two dimensional array of extraction openings 50*a, b, c*, for example to make it less rough, i.e. smoother, than other areas. Additionally or alternatively a coating may be applied to the area, for example in the form of a layer applied to the undersurface or a sticker adhered to the undersurface.

As can be seen in FIG. 6, one or more supply openings 210 surround the openings 50*a, b, c*. Liquid 300 is supplied through the supply opening 210 onto the lower surface or undersurface 51 of the fluid handling structure 12. In use liquid from the at least one liquid supply opening 210 adheres to the undersurface 51 of the fluid handling structure 12. The liquid moves radially inwardly with respect to space 11 and is extracted through the openings 50*a, b, c* of the two dimensional array of liquid extraction openings.

FIGS. 8 and 9 show the position of the liquid 300 provided on the undersurface 51 through the at least one liquid supply opening 210.

The liquid supply opening 210 may be in the form of a continuous slit or a plurality of openings. The liquid 300 flows radially inwardly and is extracted by the outer most extractor openings 50*c*. In the case of the trailing edge (or in certain embodiments elsewhere) the meniscus of the liquid 300 may contact the meniscus 320 extending between the undersurface 51 and the facing surface, as illustrated in FIG. 9. Thus, the openings of the two dimensional array extract liquid from the space 11 and extract liquid on the undersurface 51 from the at least one liquid supply opening 210. Thus, it can be seen that the at least one liquid supply opening 210 helps ensure that the radially outer openings 50*c* of the two dimensional array of extraction openings are kept wet.

At the same time, liquid from the space 11 moves radially outwardly and is extracted by inner most openings 50*a* of the two dimensional array of liquid extraction openings. Gas may be extracted through the openings 50*b* in the center of the two dimensional array of liquid extraction openings (as illustrated by arrow 100). In use, a meniscus of the liquid on the undersurface may touch/contact the meniscus 320 extending between the undersurface and the facing surface as illustrated in FIG. 9.

The effect of having liquid on the undersurface of the fluid handling structure 12 is that droplets on the facing surface may collide with the liquid on the undersurface and thereby be extracted. Only smaller droplets of liquid on the facing surface can pass under the liquid on the undersurface 51 and then collide with the meniscus 320 extending between the fluid handling structure and the undersurface 51. Such smaller droplets may cause only small bubbles to be included into the liquid. Such smaller droplets are likely to have dissolved in the immersion liquid before they reach a position where radiation from the projection beam PB may pass through them.

In an embodiment, in order to mitigate the likelihood of bubbles being present in a space through which the projection beam PB passes, gas surrounding the meniscus 320 is arranged to be carbon dioxide. Such carbon dioxide may be provided through an outlet in the fluid handling structure (such as that illustrated as 400 in FIGS. 6-10) or may be provided by a separate means.

Very small bubbles of gas may dissolve in the immersion liquid before they reach the exposure area of the space 11. In an embodiment, which can be combined with any other embodiment, the fact that dissolution speed is dependent upon the type of the trapped gas and the immersion liquid properties is used.

A bubble of carbon dioxide ($CO_2$) typically dissolves faster than a bubble of air. A bubble of $CO_2$ which has a solubility fifty-five (55) times larger than that of nitrogen and a diffusivity of 0.86 times that of nitrogen will typically dissolve in a time thirty-seven (37) times shorter than the time for a bubble of the same size of nitrogen to dissolve.

U.S. patent application publication no. US 2011-0134401, hereby incorporated in its entirety by reference, describes supplying a gas with a solubility in the immersion liquid greater than or equal to $5\times10^{-3}$ mol/kg at 20° C. and 1 atm total pressure to a region adjacent the space 11. It also describes supplying a gas with a diffusivity in the immersion liquid greater than or equal to $3\times10^{-5}$ cm$^2$ s$^{-1}$ at 20° C. and 1 atm total pressure to a region adjacent the space 11. It also describes supplying a gas with a product of diffusivity and solubility in the immersion liquid of greater than that of air at 20° C. and 1 atm total pressure to a region adjacent the space 11.

If the bubble of gas is of a gas which has a high diffusivity, solubility or product of diffusivity and solubility in the immersion liquid, it will dissolve into the immersion liquid much faster. Therefore, using an embodiment of the invention should reduce the number of imaging defects thereby allowing higher throughput (e.g., higher speed of the substrate W relative to the liquid handling structure 12) and lower defectivity.

Therefore, an embodiment of the present invention provides a gas supplying device configured to supply gas to a region (e.g. to a volume, or a towards an area) adjacent the space 11. For example, gas is provided such that it is present in the region adjacent to the meniscus 320 extending between the facing surface and the liquid handling structure 12.

An example gas is carbon dioxide which may be desirable because it is readily available and may be used in immersion systems for other purposes. Carbon dioxide has solubility in water at 20° C. and 1 atm total pressure of $1.69\times10^{-3}$ kg/kg or $37\times10^{-3}$ mol/kg. Any non-reactive gas which readily dissolves in immersion liquid is suitable.

An embodiment of the present invention herein described may form a $CO_2$ atmosphere around the meniscus 320 of immersion liquid so that an inclusion of gas into the immersion liquid creates a gas inclusion which dissolves in the immersion liquid.

By using gaseous $CO_2$ the problem associated with the meniscus colliding with a droplet of liquid may be reduced if not alleviated. Typically a droplet of 300 micrometers would produce a bubble of 30 micrometers in diameter (i.e. a tenth the size). Such a bubble of carbon dioxide would usually dissolve in the immersion liquid before reaching the exposure area. (Note that a droplet of such a size may cause one or more other problems). Therefore the problems caused by a droplet could be less significant. The immersion system could be more tolerant of interacting with immersion liquid which had escaped from the space.

The gas may be supplied through a gas supply opening 400 in the undersurface of the fluid handling structure, for example.

Because the extraction openings 50*a, b, c* are provided in a two dimensional array, it is not necessary that the position of the meniscus 320 extending between the fluid handling structure and the facing surface is pinned in position. That is, the position of the meniscus 320 may vary in the radial direction, as described above. For example, the meniscus 320 may extend between a central opening 50*b* of the two dimensional array of liquid extraction openings and the facing surface. That is, the two dimensional character of the array of liquid extraction openings allows a buffer to exist. As a result, a large gas flow out through the openings 50*a, b, c* is not necessary because the pinning force required is not so large. Therefore, a gas flow of between 0.02 and 0.2 l/min/mm out of extraction openings 50*a, b, c* can be used. This compares with, for example, a gas flow of at least about 0.4 l/min/mm in the case where a single line of openings 50 pins the meniscus 320 in place (as described in US 2008-0212046). As a result, the lower flow rate of liquid results in less evaporation of liquid and thereby a lower cooling load. The presence of a lower flow rate results in a lower force being generated between the fluid handling structure 12 and the facing surface (e.g. substrate). A lower force is beneficial as a lower force acting on the substrate W removes a source of potential imaging inaccuracy.

In an embodiment an underpressure source (e.g. suction source) 500 is provided with the fluid handling structure. The underpressure source 500 has a controller to control the underpressure applied to the openings 50 such that the flow rate out of the openings 50 of the two dimensional array of liquid extraction openings falls within the above mentioned range.

In an embodiment additionally or alternatively the fluid handling structure has a fluid supply and/or recovery system configured to supply and/or recover fluid from the openings present comprising one or all of the immersion fluid supply openings 180, openings 50*a, b, c*, and extraction openings 210. The system is configured to supply/recover fluid at a rate which is different depending upon the peripheral (e.g., circumferential) position.

FIG. 10 illustrates a fluid handling structure 12 which is part of a liquid supply system. The fluid handling structure 12 extends around the periphery (e.g. circumference) of the final element of the projection system PS.

A plurality of openings 20 in the surface which in part defines the space 11 provides the liquid to the space 11. The liquid passes through openings 29, 20 in side walls 28, 22 respectively through respective chambers 24, 26 prior to entering the space 11.

A seal is provided between the bottom of the fluid handling structure 12 and a facing surface, e.g. the substrate W, or a substrate table WT, or both. In FIG. 10 a seal device is configured to provide a contactless seal and is made up of several components. Radially outwardly from the optical axis of the projection system PS, there is provided a (optional) flow control plate 52 which extends into the space 11. The control plate 52 may have an opening 55 to permit flow liquid therethrough; the opening 55 may be beneficial if the control plate 52 is displaced in the Z direction (e.g., parallel to the optical axis of the projection system PS). Radially outwardly of the flow control plate 52 on the bottom surface of the fluid handling structure 12 facing (e.g., opposite) the facing surface, e.g., the substrate W, may be an immersion fluid supply opening 180. The immersion fluid supply opening 180 can provide immersion fluid (e.g. liquid, for example an aqueous solution or water) in a direction towards the facing surface. During imaging this may be useful in preventing bubble formation in the immersion liquid by filling a gap between the substrate W and substrate table WT with liquid.

Radially outwardly of the immersion fluid supply opening 180 may be an extractor assembly 70 to extract liquid from between the fluid handling structure 12 and the facing surface. The extractor assembly 70 may operate as a single phase or as a dual phase extractor. The extractor assembly 70 acts as a meniscus pinning feature.

The extractor assembly 70 as a single phase extractor may comprise a liquid removal device, extractor or inlet such as the one disclosed in United States patent application publication no. US 2006-0038968, incorporated herein in its entirety by reference. In an embodiment, the liquid removal device 70 comprises an inlet which is covered in a porous material 111 which is used to separate liquid from gas to enable single-liquid phase liquid extraction. An under pressure in chamber 121 is chosen is such that the meniscuses formed in the holes of the porous material 111 substantially prevent ambient gas from being drawn into the chamber 121 of the liquid removal device 70. However, when the surface of the porous material 111 comes into contact with liquid there is no meniscus to restrict flow and the liquid can flow freely into the chamber 121 of the liquid removal device 70.

The porous material 111 has a large number of small holes each with a dimension, e.g. a width, such as a diameter, in the range of 5 to 50 micrometers. The porous material 111 can be seen as a two dimensional array of extraction openings. The porous material 111 can be seen as a micro-sieve with extraction openings of a size of less than 50 μm. The porous material 111 may be maintained at a height in the range of 50 to 300 micrometers above a surface, such as a facing surface, from which liquid is to be removed, e.g. the surface of a substrate W. In an embodiment, porous material 111 is at least slightly liquidphilic, i.e. having a dynamic contact angle of less than or equal to 90°, desirably less than or equal to 85° or desirably less than or equal to 80°, to the immersion liquid, e.g. water.

In an embodiment, the liquid supply system has an arrangement to deal with variations in the level of the liquid. This is so that liquid which builds up between the projection system PS and the liquid confinement structure 12 (forming, e.g., a meniscus 410) can be dealt with and does not escape. One way of dealing with this liquid is to provide a lyophobic (e.g., hydrophobic) coating. The coating may form a band around the top of the fluid handling structure 12 surrounding the opening and/or around the last optical element of the projection system PS. The coating may be radially outward of the optical axis of the projection system PS. The lyophobic (e.g., hydrophobic) coating helps keep the immersion liquid in the space 11. An additional or alternative way of dealing with this liquid is to provide an outlet 201 to remove liquid reaching a certain point (e.g., height) relative to the liquid confinement structure 12 and/or projection system PS.

As illustrated in FIG. 10, a liquid supply opening 210 and gas supply opening 400 may be provided as in the embodiment of FIGS. 6-9. The principle of operation is the same and allows the collection of large droplets 600 through their collision with the liquid 300. Smaller droplets 610 pass under the liquid 300. However, smaller droplets 610, when they collide with meniscus 320 are likely only to form small bubbles which will dissolve before they reach the space through which the projection beam PB projects. This is especially so if carbon dioxide or other highly soluble gas is provided through the gas supply opening 400.

In an embodiment, there is provided a fluid handling structure for a lithographic apparatus, the fluid handling structure to confine liquid to a space, the fluid handling structure having, on an undersurface surrounding the space, a liquid supply opening to supply a liquid onto an undersurface of the fluid handling structure and, radially inward with respect to the space of the liquid supply opening, a two dimensional array of liquid extraction openings to extract a liquid from the space and to extract liquid on the undersurface from the liquid supply opening.

In an embodiment, there is provided a fluid handling structure for a lithographic apparatus, the fluid handling structure having, on an undersurface surrounding a space for liquid: a two dimensional array of liquid extraction openings radially outward of the space; and a liquid supply opening to supply a liquid onto an undersurface of the fluid handling structure, the liquid supply opening radially outward of the two dimensional array of liquid extraction openings, wherein the two dimensional array of liquid extraction openings is configured to extract a liquid from the space and to extract the liquid supplied to the undersurface by the liquid supply opening.

In an embodiment, the liquid supply opening and two dimensional array of liquid extraction openings are arranged such that, in use, a gas gap is present between the liquid supplied on and removed from the undersurface and a surface facing the undersurface. In an embodiment, a meniscus of the liquid provided on the undersurface is in contact with a meniscus of the liquid from the space extending between the undersurface and a surface facing the undersurface. In an embodiment, the two dimensional array of liquid extraction openings is next to the liquid supply opening. In an embodiment, any openings of the two dimensional array of liquid extraction openings are adjacent one another. In an embodiment, the two dimensional array of liquid extraction openings comprises at least three radially separated rows of openings. In an embodiment, openings of the two dimensional array of liquid extraction openings have a cross-sectional area equivalent to a circular hole with a diameter selected from the range of 50-150 μm. In an embodiment, openings at a radial outer and/or radial inner position of the two dimensional array of liquid extraction openings have a cross-sectional area greater than openings radially in the center of the two dimensional array. In an embodiment, the two dimensional array of liquid extraction openings comprises a micro sieve in which extraction openings have a size of less than or equal to 50 μm. In an embodiment, the fluid handling structure further comprises a gas supply opening radially outward of the liquid supply opening. In an embodiment, the fluid handling structure comprises a further liquid supply opening to supply liquid inwardly, relative to a location where the patterned beam of the lithographic apparatus is to be projected, of the two dimensional array of liquid extraction openings. In an embodiment, the liquid in contact with the undersurface flows from the liquid supply opening to the two dimensional array of liquid extraction openings as a film or a droplet. In an embodiment, a radial width of the two dimensional array of liquid extraction openings is selected from the range of 0.5-3.0 mm. In an embodiment, the undersurface between the liquid supply opening and the two dimensional array of liquid extraction openings is liquidphilic.

In an embodiment, there is provided a fluid handling device comprising the fluid handling structure described herein and a underpressure source connected to the two dimensional array of liquid extraction openings, the underpressure source having a controller to extract gas at a rate selected from the range of 0.02-0.2 l/min/mm through the two dimensional array of liquid extraction openings.

In an embodiment, there is provided a lithographic apparatus comprising the fluid handling structure described herein or the fluid handling device described herein.

In an embodiment, there is provided a fluid handling structure for a lithographic apparatus, the fluid handling structure having, on an undersurface surrounding a space to confine fluid, a two dimensional array of liquid extraction openings and a liquid supply opening to keep radially outer openings of the two dimensional array wet.

In an embodiment, there is provided a device manufacturing method, comprising: providing a liquid between a final element of a projection system and a surface facing the final element and confining the liquid to a space through which a projection beam of radiation passes using a fluid handling structure; providing a radially inward flow of liquid through a liquid supply opening on an undersurface of the fluid handling structure; and extracting liquid from the space and from the undersurface using a two dimensional array of liquid extraction openings.

Although specific reference may be made in this text to the use of lithographic apparatus in the manufacture of ICs, it should be understood that the lithographic apparatus described herein may have other applications, such as the manufacture of integrated optical systems, guidance and detection patterns for magnetic domain memories, flat-panel displays, liquid-crystal displays (LCDs), thin-film magnetic heads, etc. The skilled artisan will appreciate that, in the context of such alternative applications, any use of the terms "wafer" or "die" herein may be considered as synonymous with the more general terms "substrate" or "target portion", respectively. The substrate referred to herein may be processed, before or after exposure, in for example a track (a tool that typically applies a layer of resist to a substrate and develops the exposed resist), a metrology tool and/or an inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

The terms "radiation" and "beam" used herein encompass all types of electromagnetic radiation, including ultraviolet (UV) radiation (e.g. having a wavelength of or about 365, 248, 193, 157 or 126 nm). The term "lens", where the context allows, may refer to any one or combination of various types of optical components, including refractive and reflective optical components.

While specific embodiments of the invention have been described above, it will be appreciated that the invention, at least in the form a method as herein described, may be practiced otherwise than as described. For example, the embodiments of the invention, at least in the form of a method, may take the form of a computer program containing one or more sequences of machine-readable instructions describing a method as disclosed above, or a data storage medium (e.g. semiconductor memory, magnetic or optical disk) having such a computer program stored therein. Further, the machine readable instruction may be embodied in two or more computer programs. The two or more computer programs may be stored on one or more different memories and/or data storage media.

Any controllers described herein may each or in combination be operable when the one or more computer programs are read by one or more computer processors located within at least one component of the lithographic apparatus. The controllers may each or in combination have any suitable configuration for receiving, processing, and sending signals. One or more processors are configured to communicate with the at least one of the controllers. For example, each controller may include one or more processors for executing the computer programs that include machine-readable instructions for the methods described above. The controllers may include data storage medium for storing such computer programs, and/or hardware to receive such medium. So the controller(s) may operate according the machine readable instructions of one or more computer programs.

An embodiment of the invention may be applied to substrates with a diameter of 300 mm or 450 mm or any other size.

One or more embodiments of the invention may be applied to any immersion lithography apparatus, in particular, but not exclusively, those types mentioned above and whether the immersion liquid is provided in the form of a bath, only on a localized surface area of the substrate, or is unconfined. In an unconfined arrangement, the immersion liquid may flow over the surface of the substrate and/or substrate table so that substantially the entire uncovered surface of the substrate table and/or substrate is wetted. In such an unconfined immersion system, the liquid supply system may not confine the immersion liquid or it may provide a proportion of immersion liquid confinement, but not substantially complete confinement of the immersion liquid.

A liquid supply system as contemplated herein should be broadly construed. In certain embodiments, it may be a mechanism or combination of structures that provides a liquid to a space between the projection system and the substrate and/or substrate table. It may comprise a combination of one or more structures, one or more fluid openings including one or more liquid openings, one or more gas openings or one or more openings for two phase flow. The openings may each be an inlet into the immersion space (or an outlet from a fluid handling structure) or an outlet out of the immersion space (or an inlet into the fluid handling structure). In an embodiment, a surface of the space may be a portion of the substrate and/or substrate table, or a surface of the space may completely cover a surface of the substrate and/or substrate table, or the space may envelop the substrate and/or substrate table. The liquid supply system may optionally further include one or more elements to control the position, quantity, quality, shape, flow rate or any other features of the liquid.

In an embodiment, the lithographic apparatus is a multi-stage apparatus comprising two or more tables located at the exposure side of the projection system, each table comprising and/or holding one or more objects. In an embodiment, one or more of the tables may hold a radiation-sensitive substrate. In an embodiment, one or more of the tables may hold a sensor to measure radiation from the projection system. In an embodiment, the multi-stage apparatus comprises a first table configured to hold a radiation-sensitive substrate (i.e., a substrate table) and a second table not configured to hold a radiation-sensitive substrate (referred to hereinafter generally, and without limitation, as a measurement and/or cleaning table). The second table may comprise and/or may hold one or more objects, other than a radiation-sensitive substrate. Such one or more objects may include one or more selected from the following: a sensor to measure radiation from the projection system, one or more alignment marks, and/or a cleaning device (to clean, e.g., the liquid confinement structure).

In an embodiment, the lithographic apparatus may comprise an encoder system to measure the position, velocity, etc. of a component of the apparatus. In an embodiment, the component comprises a substrate table. In an embodiment, the component comprises a measurement and/or cleaning table. The encoder system may be in addition to or an alternative to the interferometer system described herein for the tables. The encoder system comprises a sensor, transducer or readhead associated, e.g., paired, with a scale or grid. In an embodiment, the movable component (e.g., the substrate table and/or the measurement and/or cleaning table) has one or more scales or grids and a frame of the lithographic apparatus with respect to which the component moves has one or more of sensors, transducers or readheads. The one or more of sensors, transducers or readheads cooperate with the scale(s) or grid(s) to determine the position, velocity, etc. of the component. In an embodiment, a frame of the lithographic apparatus with respect to which a component moves has one or more scales or grids and the movable component (e.g., the substrate table and/or the measurement and/or cleaning table) has one or more of sensors, transducers or readheads that cooperate with the scale(s) or grid(s) to determine the position, velocity, etc. of the component.

In an embodiment, the lithographic apparatus comprises a liquid confinement structure that has a liquid removal device (or meniscus pinning feature) having an inlet covered with a mesh or similar porous material. The mesh or similar porous material provides a two-dimensional array of holes contacting the immersion liquid in a space between the final element of the projection system and a movable table (e.g., the substrate table). In an embodiment, the mesh or similar porous material comprises a honeycomb or other polygonal mesh. In an embodiment, the mesh or similar porous material comprises a metal mesh. In an embodiment, the mesh or similar porous material extends all the way around the image field of the projection system of the lithographic apparatus. In an embodiment, the mesh or similar porous material is located on a bottom surface of the liquid confinement structure and has a surface facing towards the table. In an embodiment, the mesh or similar porous material has at least a portion of its bottom surface generally parallel with a top surface of the table.

The descriptions above are intended to be illustrative, not limiting. Thus, it will be apparent to one skilled in the art that modifications may be made to the invention as described without departing from the scope of the claims set out below.

The invention claimed is:

1. A fluid handling structure for a lithographic apparatus, the fluid handling structure to confine liquid to a space, the fluid handling structure having, on an undersurface surrounding the space, a liquid supply opening to supply a liquid onto an undersurface of the fluid handling structure and, radially inward with respect to the space of the liquid supply opening, a two dimensional array of liquid extraction openings to extract liquid from the space and to extract liquid on the undersurface from the liquid supply opening, the liquid supply opening and two dimensional array of liquid extraction openings configured to respectively supply and extract a majority of the liquid on the undersurface without such liquid contacting a surface facing the undersurface.

2. The fluid handling structure of claim 1, wherein the liquid supply opening and two dimensional array of liquid extraction openings are arranged such that, in use, a gas gap is present between the liquid supplied on and removed from the undersurface and the surface facing the undersurface.

3. The fluid handling structure of claim 1, wherein a meniscus of the liquid provided on the undersurface comes in contact with a meniscus of the liquid from the space extending between the undersurface and the surface facing the undersurface.

4. The fluid handling structure of claim 1, wherein the two dimensional array of liquid extraction openings is next to the liquid supply opening.

5. The fluid handling structure of claim 1, wherein any openings of the two dimensional array of liquid extraction openings are adjacent one another.

6. The fluid handling structure of claim 1, wherein the two dimensional array of liquid extraction openings comprises at least three radially separated rows of openings.

7. The fluid handling structure of claim 1, wherein openings of the two dimensional array of liquid extraction openings have a cross-sectional area equivalent to a circular hole with a diameter selected from the range of 50-150 µm.

8. The fluid handling structure of claim 1, wherein openings at a radial outer and/or radial inner position of the two dimensional array of liquid extraction openings have a cross-sectional area greater than openings radially in the center of the two dimensional array.

9. The fluid handling structure of claim 1, wherein the two dimensional array of liquid extraction openings comprises a micro sieve in which extraction openings have a size of less than or equal to 50 µm.

10. The fluid handling structure of claim 1, further comprising a gas supply opening radially outward of the liquid supply opening.

11. The fluid handling structure of claim 1, comprising a further liquid supply opening to supply liquid inwardly, relative to a location where a patterned beam of the lithographic apparatus is to be projected, of the two dimensional array of liquid extraction openings.

12. The fluid handling structure of claim 1, wherein the liquid in contact with the undersurface flows from the liquid supply opening to the two dimensional array of liquid extraction openings as a film or a droplet.

13. The fluid handling structure of claim 1, wherein a radial width of the two dimensional array of liquid extraction openings is selected from the range of 0.5-3.0 mm.

14. The fluid handling structure of claim 1, wherein the undersurface between the liquid supply opening and the two dimensional array of liquid extraction openings is liquidphilic.

15. A fluid handling structure for a lithographic apparatus, the fluid handling structure having, on an undersurface surrounding a space for liquid:
    a two dimensional array of liquid extraction openings radially outward of the space; and
    a liquid supply opening to supply a liquid onto an undersurface of the fluid handling structure, the liquid supply opening radially outward of the two dimensional array of liquid extraction openings,
    wherein the two dimensional array of liquid extraction openings is configured to extract a liquid from the space and to extract the liquid supplied to the undersurface by the liquid supply opening, and
    wherein the liquid supply opening and two dimensional array of liquid extraction openings configured to respectively supply and extract a majority of the liquid on the undersurface without such liquid contacting a surface facing the undersurface.

16. A lithographic apparatus comprising:
    a projection system configured to project a beam of a radiation through a liquid in a space; and
    a fluid handling structure to confine liquid to the space, the fluid handling structure having, on an undersurface surrounding the space, a liquid supply opening to supply a liquid onto an undersurface of the fluid handling structure and, radially inward with respect to the space of the liquid supply opening, a two dimensional array of liquid extraction openings to extract a liquid from the space and to extract liquid on the undersurface from the liquid supply opening, the liquid supply opening and two dimensional array of liquid extraction openings configured to respectively supply and extract a majority of the liquid on the undersurface without such liquid contacting a surface facing the undersurface.

17. A fluid handling structure for a lithographic apparatus, the fluid handling structure having, on an undersurface surrounding a space to confine liquid, a two dimensional array of liquid extraction openings and a liquid supply opening, outward relative to the space of the two dimensional array of liquid extraction openings, configured to keep radially outer openings of the two dimensional array wet at least when a meniscus of liquid from the space that extends between radially inner openings of the two dimensional array and a surface facing the undersurface is spaced apart from a meniscus of liquid from the liquid supply opening.

18. A device manufacturing method, comprising:
  providing a liquid between a final element of a projection system and a surface facing the final element and confining the liquid to a space through which a projection beam of radiation passes using a fluid handling structure;
  providing a radially inward flow of liquid through a liquid supply opening on an undersurface of the fluid handling structure; and
  extracting liquid from the space and from the undersurface using a two dimensional array of liquid extraction openings, wherein the providing and the extracting respectively supply and extract a majority of the liquid on the undersurface without such liquid contacting a surface facing the undersurface.

19. A lithographic apparatus comprising:
  a projection system configured to project a beam of a radiation through a liquid in a space; and
  a fluid handling structure to confine liquid to the space, the fluid handling structure having, at an undersurface surrounding the space, a two dimensional array of liquid extraction openings and a liquid supply opening, outward relative to the space of the two dimensional array of liquid extraction openings, configured to keep radially outer openings of the two dimensional array wet at least when a meniscus of liquid from the space that extends between radially inner openings of the two dimensional array and a surface facing the undersurface is spaced apart from a meniscus of liquid from the liquid supply opening.

20. A device manufacturing method, comprising:
  providing a liquid between a final element of a projection system and a surface facing the final element and confining the liquid to a space through which a projection beam of radiation passes using a fluid handling structure;
  extracting liquid from the space using a two dimensional array of liquid extraction openings at an undersurface of the fluid handling structure; and
  providing liquid through a liquid supply opening located at an undersurface of the fluid handling structure and located outward relative to the space of the two dimensional array of liquid extraction openings, to keep radially outer openings of the two dimensional array wet at least when a meniscus of liquid from the space that extends between radially inner openings of the two dimensional array and the surface facing the final element is spaced apart from a meniscus of liquid from the liquid supply opening.

* * * * *